(12) United States Patent
Clark et al.

(10) Patent No.: US 7,241,560 B2
(45) Date of Patent: Jul. 10, 2007

(54) BASIC QUENCHER/DEVELOPER SOLUTIONS FOR PHOTORESISTS

(75) Inventors: Shan C. Clark, Forest Grove, OR (US); Kim-Khanh Ho, Fremont, CA (US); James S. Clarke, Portland, OR (US); Ernisse S. Putna, Beaverton, OR (US); Wang S. Yueh, Portland, OR (US); Robert P. Meagley, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 11/143,126

(22) Filed: Jun. 1, 2005

(65) Prior Publication Data

US 2006/0024616 A1 Feb. 2, 2006

Related U.S. Application Data

(63) Continuation-in-part of application No. 10/883,457, filed on Jun. 30, 2004.

(51) Int. Cl.
*G03F 7/36* (2006.01)
(52) U.S. Cl. .................................... 430/322
(58) Field of Classification Search ............. 430/322
See application file for complete search history.

(56) References Cited

U.S. PATENT DOCUMENTS 4,944,837 A * 7/1990 Nishikawa et al. ............ 216/41
6,924,086 B1 * 8/2005 Arena-Foster et al. ...... 430/311
2004/0072097 A1 * 4/2004 Kodama ................... 430/270.1

OTHER PUBLICATIONS

Jackson, Kevin, et al., Microemulsions in Supercritical Hydrochlorofluorocarbons, Langmuir 1996, 12, pp. 5289-5295, © 1996 American Chemical Society.
Namatsu, Hideo, et al., Supercritical resist dryer, J. Vac. Sci. Technol. B 18(2), Mar./Apr. 2000, pp. 780-784, © 2000 American Vacuum Society.
Selva, Maurizio, et al., The synthesis of alkyl carbamates from primary aliphatic amines and dialkyl carbonates in supercritical carbon dioxide, Tetrahedron Letters 43 (2002), pp. 1217-1219, © 2002 Elsevier Science Ltd.
Webb, Kimberly F., et al., Solubility and diffusion of carbon dioxide in polymers, Fluid Phase Equilibria 158-160 (1999) pp. 1029-1034, © 1999 Elsevier Science B.V.
Ziegler, Kirk J., et al., Producing 'pH switches' in biphasic water-$CO_2$ systems, J. of Supercritical Fluids 27 (2003) pp. 109-117, © 2002 Elsevier Science B.V.

* cited by examiner

*Primary Examiner*—Hoa Van Le
(74) *Attorney, Agent, or Firm*—Blakely, Sokoloff, Taylor & Zafman LLP (57) ABSTRACT

A basic developer/quencher solution formulated to include at least one supercritical fluid or liquid solvent and a base may be used to quench a photo-generated acid within a photoresist as well as develop the photoresist. The supercritical fluid or liquid solvent may be carbon dioxide and the base may be quaternary ammonium salt that has side groups that increase the solubility of the quaternary ammonium salt in carbon dioxide.

9 Claims, 7 Drawing Sheets

BASIC QUENCHER/DEVELOPER SOLUTIONS FOR PHOTORESISTS

This Application is a Continuation-in-Part of U.S. patent application Ser. No. 10/883,457 filed on Jun. 30, 2004.

BACKGROUND OF THE INVENTION

1. Field of the Invention

The present invention relates to the field of photolithography to form integrated circuits and more particularly to the field of developing an irradiated photoresist.

2. Discussion of Related Art

Figure 1A:
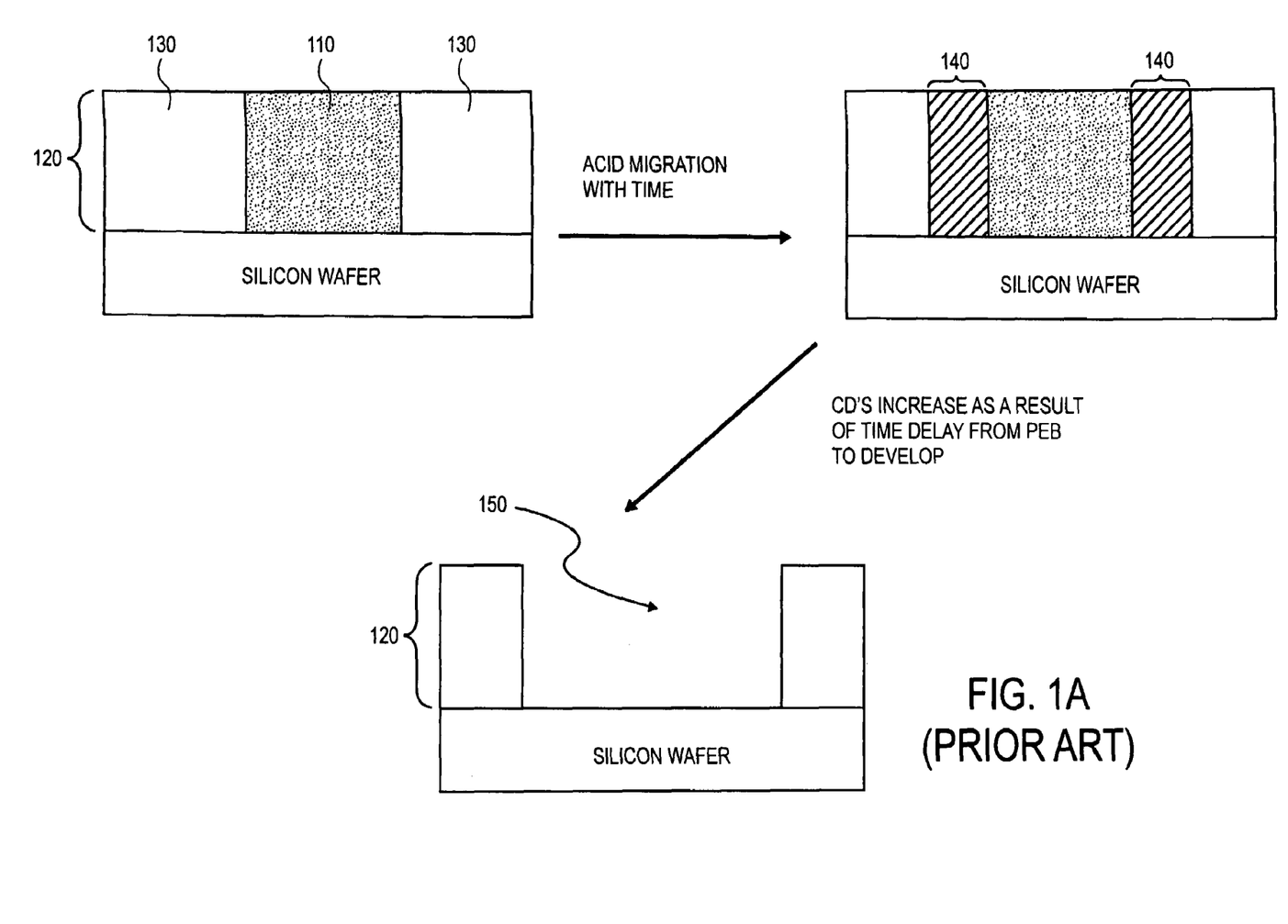
FIGS. 1a and 1b are illustrations of a cross-sectional view of prior art processes of quenching and developing a photoresist.

Photolithography is used in the field of integrated circuit processing to form the patterns that will make up the features of an integrated circuit. A photoresist is employed as a sacrificial layer to transfer a pattern to the underlying substrate. This pattern may be used a template for etching or implanting the substrate. Patterns are typically created in the photoresist by exposing the photoresist to radiation through a mask. The radiation may be visible light, mid ultraviolet (G-line, I-line), deep ultraviolet (248 nm, 193 nm), extreme ultraviolet (EUV) light, or an electron beam. In the case of a "direct write" electron beam, a mask is not necessary because the features may be drawn directly into the photoresist. Most photolithography is done using either the "i-line" method (non-chemically amplified) or the chemical amplification (CA) method. In the i-line method, the photoresist becomes directly soluble when irradiated and may be removed by a developer. In the chemical amplification method the radiation applied to the photoresist causes the photo-acid generator (PAG) to generate a small amount of a photo-generated acid throughout the resist. The acid in turn causes a cascade of chemical reactions either instantly or in a post-exposure bake. In a positive tone photoresist the photo-generated acid will deprotect the compounds used to form the photoresist to make the photoresist soluble. If a PEB (Post-exposure bake) is not used the developer will serve to stop the acid from causing further reactions. In either situation, there is typically a time lag in between the initiation of the reactions by the photo-generated acid and the quenching of the acid by the developer. As illustrated in FIG. 1a, during this time lag the photo-generated acid in an irradiated region 110 of the photoresist 120 may diffuse into the regions 130 of the photoresist 120 that were not irradiated and cause a reaction in the regions 140. The width of the opening 150 formed by developing the photoresist 120 will be greater than desired due to the migration of the photo-generated acid during the lag time into the regions 140 of the non-irradiated portion 130 of the photoresist 120. The migration of the photo-generated acid into the non-irradiated portion 130 of the photoresist 120 may cause line roughness and loss of control of the critical dimensions of the features patterned by the photoresist. A chill plate may be used to minimize the migration of the photo-generated acid after a post-exposure bake. But, as the critical dimensions of the structures formed by photolithography become smaller, and particularly as the technology passes into the 45 nanometer node, a chill plate may no longer provide the control of the acid migration necessary to achieve the critical dimensions in this node.

Figure 1B:
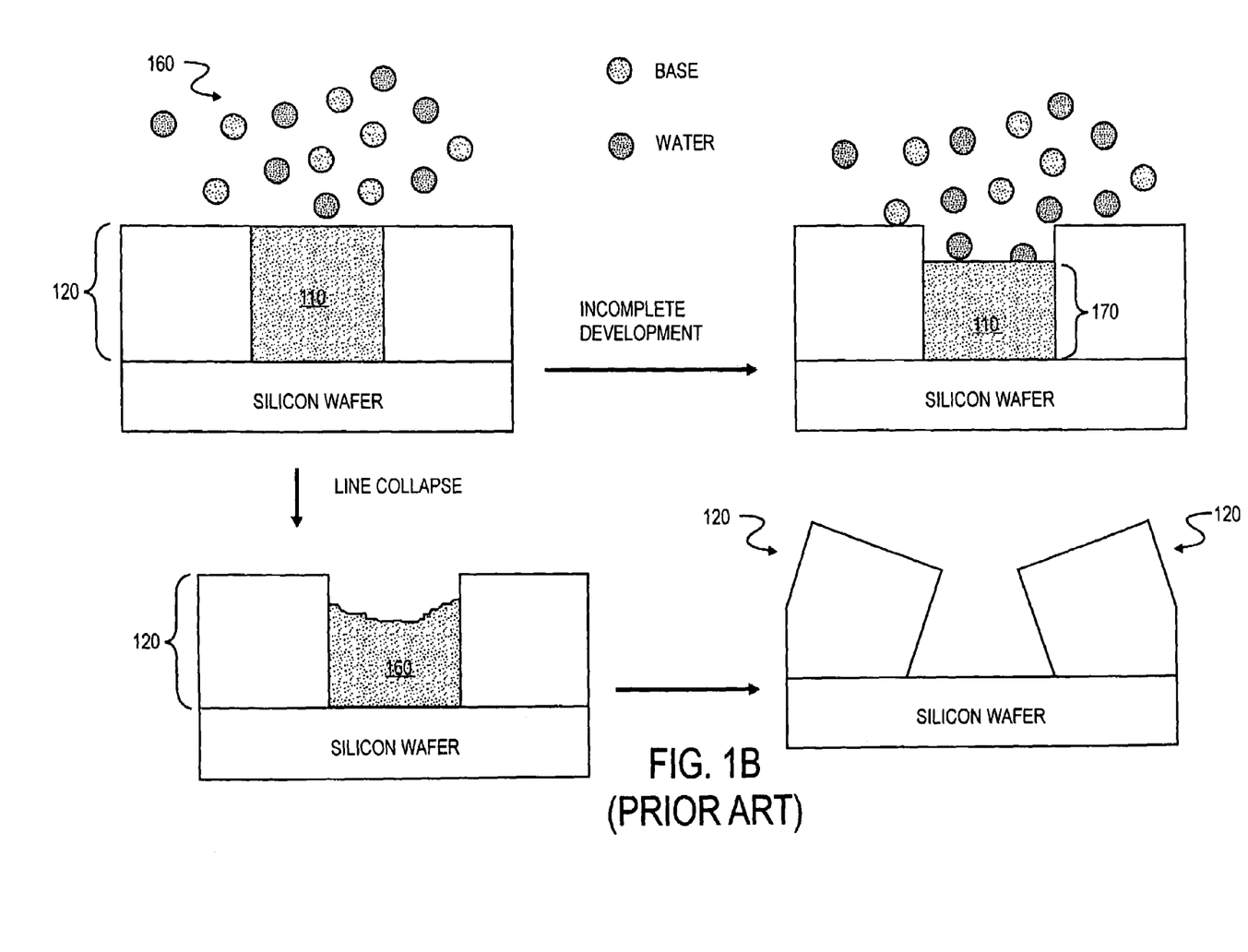

The photoresist may be removed by a developer after the photoresist is deprotected by the photo-generated acid. The deprotection by the photo-generated acid increases the solubility of the resist so that it may be removed by a basic developer. FIG. 1b illustrates a basic developer 160 that has been applied to a photoresist 120 to develop the irradiated portion 110. An organic aqueous base such as tetramethylammonium hydroxide (TMAH) may be used as the developer 160 to remove the photoresist from the irradiated areas. But, as the technology moves to the 45 nanometer node, the dimensions of the structures patterned by a photoresist mask will become so narrow that the traditional aqueous base developer may not be able to access the narrow features with high aspect ratios of 2 or higher and may fail to fully develop the irradiated portions of the photoresist. FIG. 1b illustrates the incomplete development of a photoresist 120 by the developer 160 by the area 170 of the irradiated portion 110 that was not accessed by the developer 160. Additionally, even when the developer 160 is able to fully access the irradiated area 110 of the photoresist 120 the developer 160 may cause line collapse due to the high surface tension of the aqueous developer 160, also as illustrated in FIG. 1b. The aqueous base developers therefore also affect critical dimension control. Another drawback to using aqueous base developers is that copious amounts of the aqueous developer and water rinses to remove the aqueous developer are used, thus creating a large amount of waste.

DETAILED DESCRIPTION OF THE PRESENT INVENTION

Described herein are compositions formulated with at least one supercritical fluid to quench and develop a photoresist and methods of using these compositions. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art. In other instances, well known semiconductor fabrication processes, techniques, materials, equipment, etc., have not been set forth in particular detail in order to not unnecessarily obscure embodiments of the present invention.

A basic developer/quencher solution may be used to quench a photo-generated acid within a photoresist as well as to develop the photoresist. The basic developer/quencher solution may be a combination of a supercritical fluid and a base or a supercritical base. A supercritical fluid is a state of equilibrium between a liquid and a gas, that is above the critical temperature ($T_c$) and critical Pressure ($P_c$). A basic supercritical solution formulated to include at least one supercritical fluid has a low viscosity and surface tension and is capable of penetrating narrow features having high aspect ratios and the photoresist material due to the gas-like nature of the supercritical fluid. In another embodiment the basic developer/quencher solution may be a base dissolved within liquid carbon dioxide or a liquid base. Liquid carbon dioxide is also capable of penetrating narrow features having high aspect ratios and the photoresist material.

A basic supercritical or liquid solution may be used to quench and develop photoresists that are applied to various substrates to create patterns for the formation of many structures used in integrated circuits. In one embodiment, a photoresist developed by a basic or liquid supercritical or liquid solution may be used to form lines for transistor gates. In another embodiment, a photoresist developed by a basic supercritical or liquid solution may be used to form trenches or vias for interconnect lines. In one embodiment the patterned photoresist may be used to form both vias and trenches by a conventional dual damascene method. Other applications for forming microelectromechanical machines (MEMS), microfluidics structures, or other small structures are also comprehended. For the sake of simplicity a process of forming only vias will be described.

Figure 2A:
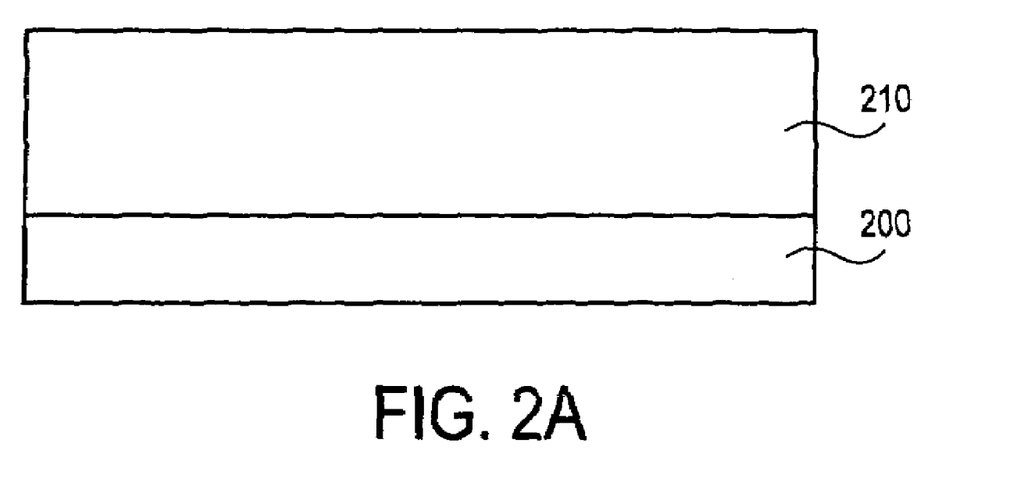
FIGS. 2a–2k are illustrations of a process of forming vias within an integrated circuit employing a basic developer/quencher solution.

In FIG. 2a, substrate 200 is provided. Substrate 200 may be any surface generated when making an integrated circuit upon which a conductive layer may be formed. In this particular embodiment the substrate 200 may be a semiconductor such as silicon, germanium, gallium arsenide, silicon-on-insulator or silicon on sapphire. A dielectric layer 210 is formed on top of substrate 200. Dielectric layer 210 may be an inorganic material such as silicon dioxide or carbon doped oxide (CDO) or a polymeric low dielectric constant material such as poly(norbornene) such as those sold under the tradename UNITY™, distributed by Promerus, LLC; polyarylene-based dielectrics such as those sold under the tradenames "SiLK™" and "GX-3™", distributed by Dow chemical Corporation and Honeywell Corporation, respectively; and poly(aryl ether)-based materials such as that sold under the tradename "FLARE™", distributed by Honeywell Corporation. The dielectric layer 210 may have a thickness in the approximate range of 2,000 and 20,000 angstroms.

Figure 2B:
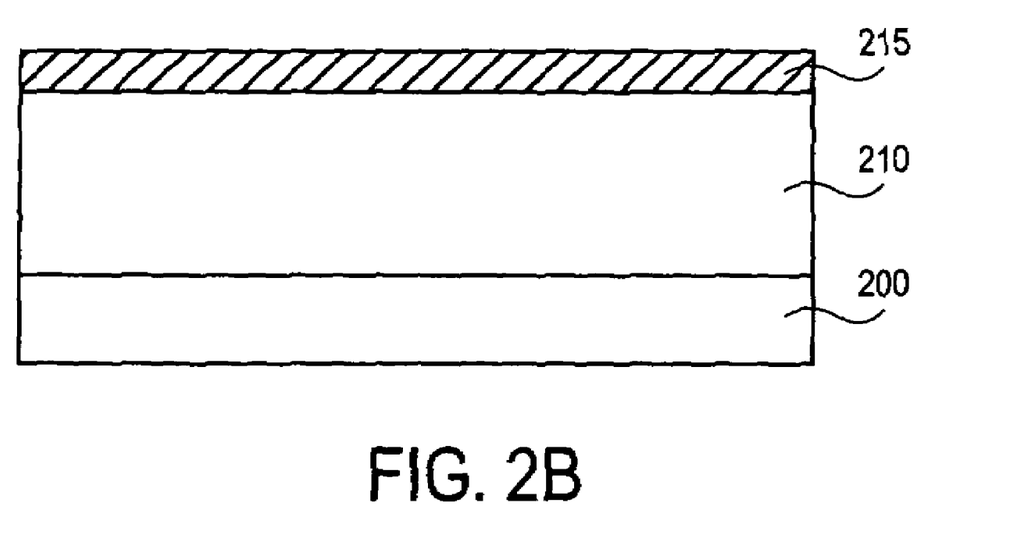

In FIG. 2b, after forming the dielectric layer 210, a bottom anti-reflective coating (BARC) 215 may be formed over the dielectric layer 210. In embodiments where non-light lithography radiation is used a BARC 215 may not be necessary. The BARC 215 is formed from an anti-reflective material that includes a radiation absorbing additive, typically in the form of a dye. The BARC 215 may serve to minimize or eliminate any coherent light from re-entering the photoresist 220, which is formed over the BARC 215 in FIG. 2c, during irradiation and patterning of the photoresist 220. The BARC 215 may be formed of a base material and an absorbant dye or pigment. In one embodiment, the base material may be an organic material, such as a polymer, capable of being patterned by etching or by irradiation and developing, like a photoresist. In another embodiment, the BARC 215 base material may be an inorganic material such as silicon dioxide, silicon nitride, and silicon oxynitride. The dye may be an organic or inorganic dye that absorbs light that is used during the exposure step of the photolithographic process.

Figure 2C:
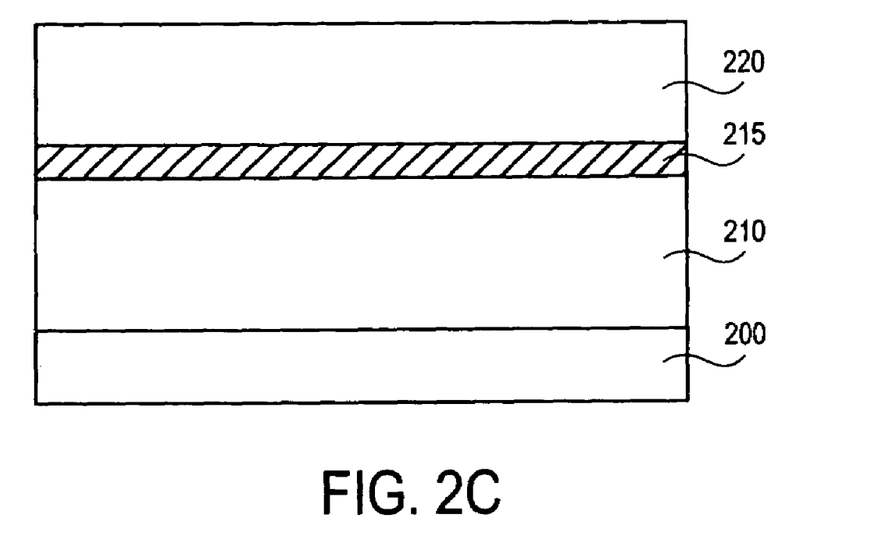

In FIG. 2c a photoresist 220 containing a photoacid generator (PAG) is formed over the BARC 215. The photoresist 220 may be positive tone or negative tone. In a positive tone photoresist the area exposed to the radiation will define the area where the photoresist will be removed. In a negative tone photoresist the area that is not exposed to the radiation will define the area where the photoresist will be removed. The photoresist 220, in this particular embodiment, is a positive resist. The photoresist 220 may have a thickness sufficient to serve as a mask during an etching or implantation step. For example, the photoresist may have a thickness in the approximate range of 500 angstroms and 2500 angstroms. In general, for implant purposes the photoresist will be thickest, for contact patterning the photoresist will be thinner than for implant purposes, and the photoresist will be thinnest for gate patterning. The photoresist 220 may contain a PAG, resins, a quencher, and additives.

Figure 2D:
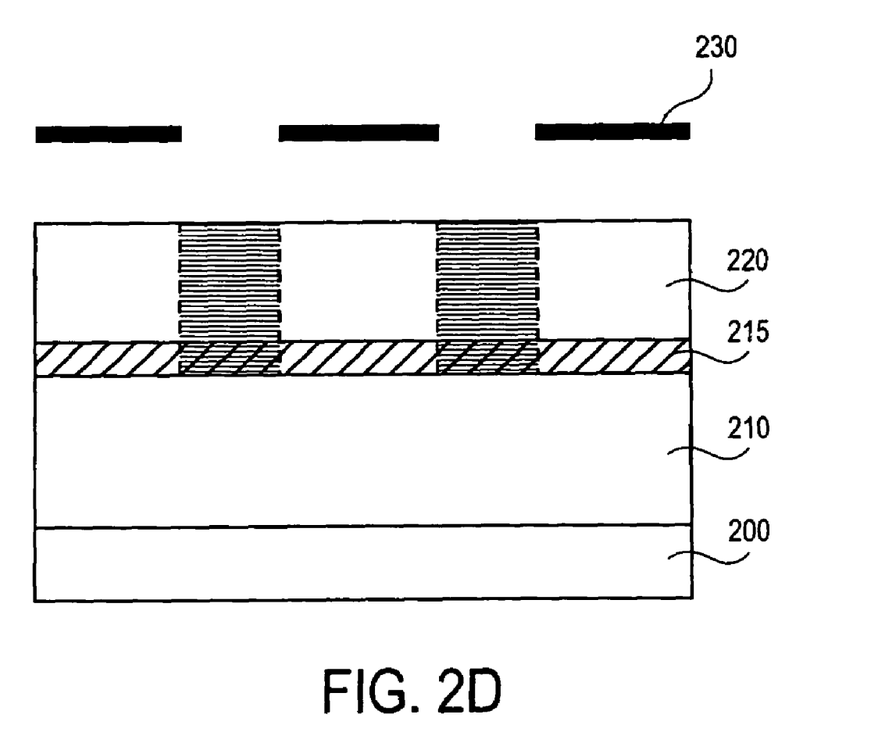
Figure 2E:
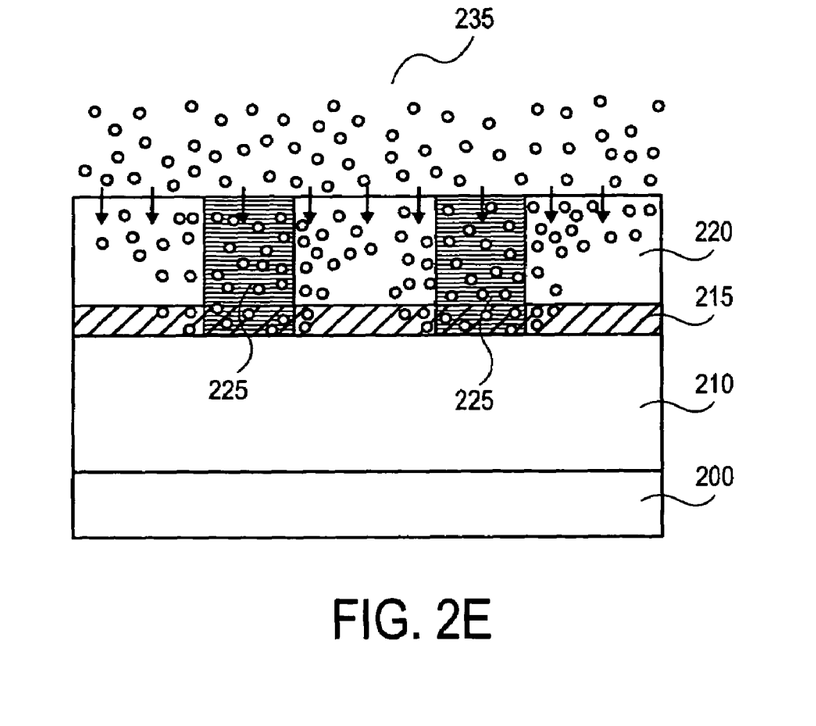

As illustrated in FIG. 2d, a mask 230 is formed over the photoresist 220. In FIG. 2e, the photoresist 220 and the BARC 215 are patterned by exposing the masked layer to radiation. The radiation may be broad band exposure, 365 nm, 248 nm, 193 nm, 157 nm, extreme ultraviolet (EUV), electron beam projection, electron beam scalpel, or ion beam lithographic technologies. In one particular embodiment, the irradiation used to pattern the photoresist 220 may be EUV having a wavelength of 13.5 nm. Upon irradiation, the photo-acid generator (PAG) will receive the energy from the radiation and generate the photo-generated acid that may serve as a catalyst to deprotect and to change the solubility of the resins. The change in the solubility of the resin is to enable the solvation of the resins and the removal of a positive photoresist by a developer. In a negative tone photoresist active species will catalyze the cross-linking of the resins and the developer that is subsequently applied will remove the portions of the negative tone photoresist that were not cross-linked. A post-exposure bake (PEB) may be performed on the photoresist 220 to enhance the mobility and hence the diffusion of the photo-generated acid within the photoresist 220. The post-exposure bake may be performed at a temperature in the approximate range of 90° C. and 150° C. and for a time sufficient for the reaction to occur, which may be in the approximate range of 30 seconds and 90 seconds. The temperature and the time of the post-exposure bake are dependent on the chemistry of the photoresist 220. The PEB may be performed in a processing chamber that is equipped to control the temperature and pressure within the chamber to create or maintain supercritical or liquid solutions. Alternatively, after the PEB, the substrate on which the photoresist 220 is formed may be removed from the PEB chamber and moved to a chamber equipped to create or maintain supercritical or liquid solutions.

As illustrated in FIG. 2e, a basic developer/quencher solution 235 may be applied to the photoresist 220 immediately after the PEB to quench the migration of the photo-generated acid. There could be no delay between the PEB and the application of the basic developer/quencher solution 235 that serves as the developer or the time lag may be up to 5 minutes. In one embodiment, the basic developer/quencher solution 235 is applied to the photoresist 220 by combining the elements of the basic developer/quencher solution 235 in situ in the reaction chamber containing the substrate on which the photoresist 220 is formed and placing the elements under pressure and temperature conditions sufficient to create a basic developer/quencher solution 235. For example, to form supercritical carbon dioxide at a temperature of 31° C. the pressure is brought up to 1072 psi. In an alternate embodiment, the basic developer/quencher solution 235 is applied to the photoresist 220 by first injecting the compound that will be made supercritical into the chamber and applying the necessary temperature and pressure conditions to the compound to make it supercritical. Secondly, if additional components are to be added to the basic developer/quencher solution 235, those components will be injected into the chamber and mixed with the supercritical compound. In another embodiment the basic developer/quencher solution 235 may be applied to the substrate 200 in liquid form. In this embodiment the basic developer/quencher solution 235 may be premixed and then dispensed or sprayed onto the substrate 200 within a wet processing tool, such as a single wafer cleaning chamber. Alternatively, the basic developer/quencher solution 235 may be bled into a reaction chamber as a mixture of gases that are either pre-mixed or mixed within the chamber and are then transformed into a liquid solution by altering the temperature and pressure within the chamber. In one embodiment, the liquid basic developer/quencher solution 235 within the reaction chamber may further be transformed into a supercritical solution by altering the temperature and pressure within the chamber. For example, when the basic solution is formed of a base dissolved within carbon dioxide the phase of the basic developer/quencher solution 235 is tunable. This is because carbon dioxide is a tunable solvent that can be changed between a gas, a liquid, and a supercritical fluid by manipulating the temperature and pressure within a reaction chamber. The substrate 200 on which the photoresist 220 is formed may be placed into the chamber either before or after the basic developer/quencher solution 235 is formed and mixed in either a supercritical or liquid form.

The basic developer/quencher solution 235 may be formulated as a supercritical solution in two general ways. The basic developer/quencher solution 235 may be formulated to include a base 1) that is separate from the supercritical fluid or 2) that is the supercritical fluid. Similarly, the basic developer/quencher solution 235 may be formulated as a liquid solution where the base may be dissolved within a liquid solvent or where the base is the liquid solvent. In the first embodiment, where the basic developer/quencher solution 235 is formulated with a supercritical fluid as the solvent and a base as an additional ingredient, the supercritical fluid may be a non-basic compound such as supercritical carbon dioxide ($SCCO_2$), sulfur oxide ($SCSO_2$), supercritical $SF_6$, chlorofluorocarbons (CFC), or hydrochlorofluorocarbons (HCFC) compounds. In the embodiment where the basic developer/quencher solution 235 is formulated with a liquid as the solvent and a base as an additional ingredient, the liquid may be liquid carbon dioxide, liquid nitrogen, or liquid helium. Other similar non-basic liquids may also be used. The supercritical fluid or the liquid in this embodiment may be a single type of solvent or a combination of solvents. A combination of supercritical fluids or liquids may be used to adjust polarity or base strength of the solution. The base that is added to a supercritical or liquid solvent may be ammonia ($NH_3$), a amine such as diethylamine or other amines including primary, secondary, and tertiary amines, an amide, a urethane, a quarternary ammonium salt such as TMAH (tetramethylammonium hydroxide) or tetrabutyl ammonium hydroxide, or the base may be an acid salt of carboxylic acid such as potassium carbonate, potassium acetate, ammonium acetate. The base may be moiety with, for example, pyridine, colliden, aniline, and pentafluoropyridine. The size of the base may be small, such as $NH_4$, or a larger molecule such as an oligomer. The base may also be a side group on a surfactant, oligomer, or a polymer. The amount of base in the basic developer/quencher solution 235 may be in the approximate range of an amount greater than zero and up to 20% of the developer solution. If the supercritical fluid and the base react, the solution may still act as a quencher and a developer. The solution may also contain a co-solvent such as methanol, ethanol, acetone, methyl ethyl ketone, dimethyl formamide, sulfolane, and NMP (N-methyl-2-pyrrolidone). The co-solvent, if added, may be up to 20% of the basic solution. The solution may also contain an additive such as a copper corrosion inhibitor or a surfactant. The surfactant may be in the approximate range of 0.1% and 3% of the basic supercritical solution. The amount of supercritical fluid in the solution will be the balance of the solution, in the approximate range of 50% and 99% of the solution. All of the components of the solution are suspended in the supercritical fluid.

In an embodiment where the basic developer/quencher solution 235 is a base and a supercritical fluid, the base may be an ion and therefore may not be soluble in the supercritical fluid. For example, the base may be TMAH (tetramethylammonium hydroxide). When the base is an insoluble ion, the basic developer/quencher solution 235 is likely to contain a co-solvent and a surfactant to stabilize the insoluble ion, such as TMAH. In such a formulation the co-solvent may be up to 20% of the solution and the surfactant may be up to 5% of the solution and more particularly in the approximate range of 1%–2% of the solution. A basic developer/quencher solution 235 containing an insoluble basic compound may be changed from a homogeneous solution to a heterogeneous emulsion with a change in temperature and pressure. By changing the solution from a single phase solution to a two phase emulsion solution, the emulsion may be encouraged to deposit on the substrate and to subsequently lift off of the substrate upon another change in temperature and pressure to change the solution back to a single phase. Depositing the emulsion on the substrate may be valuable to force the chemistry to interact with the resist surface on the substrate.

In one particular embodiment, the base that is added to the supercritical or liquid solvent may be a quartenary ammonium salt modified to have side chains that would increase the solubility of the quartenary ammonium salt within liquid or supercritical carbon dioxide. Increased solubility of the base within the supercritical or liquid solvent (such as carbon dioxide) would provide a homogeneous developer solution. A homogeneous developer solution is valuable because the base within the supercritical or liquid solvent may access the same areas as the solvent and thus provide better quenching. The side chain may include oxygen bound to silicon to increase the solubility of the base in carbon dioxide or the side chain may includes fluorine to enhance the solubility of the base in carbon dioxide. One such modified quartenary salt may be $H_3C[(OSiMe_2)nOCH_2CH_2]_4N^+OH^-$ which is soluble in carbon dioxide due to the dimethylsiloxane ($OSiMe_2$) side chains. Another such modified quartenary salt may be $[CF_3(OCF_2)nOCH_2CH_2]_4N^+OH^-$ which has enhanced solubility in carbon dioxide due to the fluorinated side chains such as $CF_3(OCF_2)$. By modifying a quartenary ammonium salt to increase solubility within carbon dioxide the basic developer/quencher solution 235 may be formulated with fewer components, thereby simplifying the production of the developer/quencher solution and saving costs both on less chemical compounds and easier disposal. The developer/quencher solution 235 may be formulated with fewer components because additional ingredients such as a co-solvent or a surfactant may not be needed to dissolve the quartenary ammonium salts within the carbon dioxide solution. It may be valuable to use a basic developer/quencher solution 235 that does not contain surfactants or additional solvents because of reduced residues and increased ease of removal of the components. For example, a basic developer/quencher solution 235 containing carbon dioxide and a quartenary ammonium salt modified to have side chains may easily be removed from a photoresist and a substrate by changing the temperature and pressure parameters to change the liquid $CO_2$ or supercritical $CO_2$ to a gas in which the modified quartenary ammonium salt would also be soluble and then removing the gaseous solution from the reaction chamber with a pump. The quartenary ammonium salts may also allow for a wider range of the pH of the developer/quencher solution 235 because the side chains of the quartenary ammonium salts may be selected to tune the pH. The pH may be tuned depending on the acidity of the photo-generated acid that is to be quenched. Also, lower volumes of the developer may be used because the ability of the developer quencher solution to develop and quench the reactions is improved with embodiments of the present invention, resulting in significant reduction in solvent usage and waste.

In the embodiment where the basic developer/quencher solution 235 may be a supercritical base, the bases that may be made supercritical include $NH_3$, $CH_3NH_2$, $(CH_3)_2NH$, and $(CH_3)_3N$. These bases are made supercritical by applying a particular combination of pressure and temperature that will bring the base above the critical points where there is minimal distinction between a liquid and a gas. For example, supercritical $NH_3$ ($SCNH_3$) is formed by a pressure of 113 Bar and 133 C. In this embodiment, the basic developer/quencher solution 235 may be one or a combination of different supercritical bases. By using a combination of supercritical bases the basic, nucleophilic, and protic properties of the basic developer/quencher solution 235 may be modified for use with different photoresist compositions. For example, polymeric resist molecules would have better solubility in a basic developer/quencher solution 235 having high polarity. Non-basic supercritical fluids, such as supercritical carbon dioxide, may also be combined with the basic supercritical fluid to control the concentration of the base. Supercritical bases are valuable because they can have high concentrations of base and the polarity range of the solution is tunable. Alternatively, the bases described in this embodiment may be a liquid instead of a supercritical fluid.

When a basic developer/quencher solution 235 is applied to the photoresist, the irradiated regions 225 of the photoresist 220 that were irradiated may be solvated by the solution. Additionally, because the basic developer/quencher solution 235 has gas-like properties, it may permeate the photoresist 220 as illustrated in FIG. 2e and quench the photo-generated acid to prevent the diffusion of the photo-generated acid into regions of the photoresist that were not irradiated and are not desired to be deprotected. The quenching of the photo-generated acid may be performed separately from the developing of the photoresist with the basic developer/quencher solution 235, or the quenching and the developing may be performed consecutively. If the quenching is performed separate from the developing of the photoresist, the basic developer/quencher solution 235 that would be used to quench the photo-generated acid may have approximately 10% lower concentration of base than the basic developer/quencher solution that would be used as the developing solution. The quenching solution may contain a different base than the developing solution due to the delay time between quenching and developing and other processing concerns. The basic developer/quencher solution 235 therefore has the ability to quench the acid almost immediately upon application and thus prevent line edge roughness and loss of CD control.

Additionally, because the basic developer/quencher solution 235 may have a surface tension that is much lower than the surface tension of water, such as when a supercritical fluid is included or liquid carbon dioxide is used, the developing solution will not cause the photoresist walls to collapse. For example, the surface tension of water at 25 degrees celsius is 75 dyne/cm and the surface tension of supercritical carbon dioxide at 25 degrees celsius is 1 dyne/cm and the surface tension of liquid carbon dioxide is 1.5. The gas-like properties of a supercritical fluid solution and the low surface tension of the solution also may penetrate high aspect ratio openings in the photoresist. In one embodiment, the pattern formed in the photoresist by irradiation may create narrow features having high aspect ratios in the range of a ratio of height to width of 2:1–5:1. If MEMS are being formed, the aspect ratios may be in the range of 5:1–20:1.

Figure 2F:
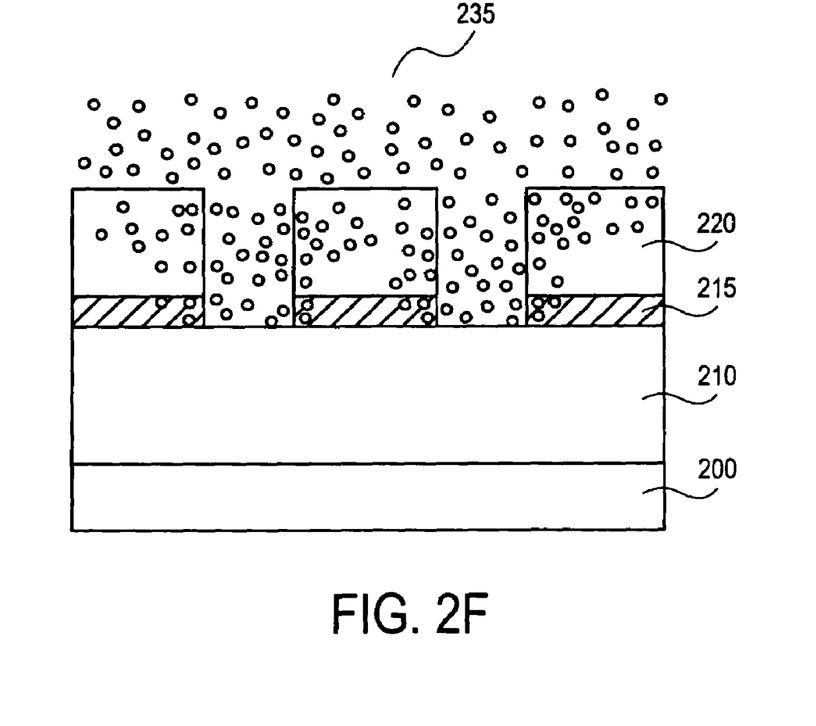
Figure 2G:
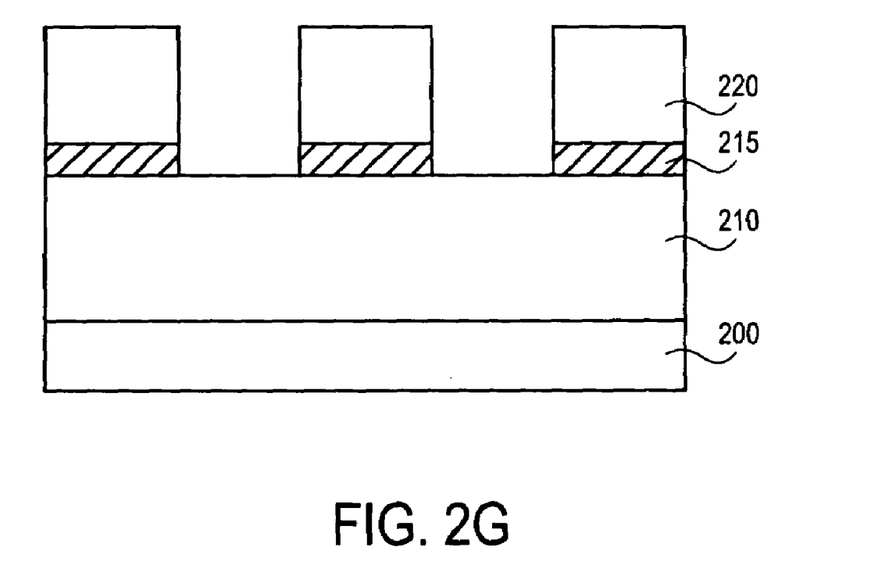

The basic developer/quencher solution 235 may be applied to the substrate for a time sufficient to develop and remove the photoresist 220 from the irradiated portions 225 of the photoresist 220, as illustrated in FIG. 2f. The basic supercritical developing solution may then be removed from the chamber by changing the pressure and temperature conditions to change the solution into a gas that may be evacuated from the process chamber. To minimize emissions, the gas may be captured and recycled. After the basic developer/quencher solution 235 is removed from the photoresist 220 as illustrated in FIG. 2g, the photoresist 220 and the dielectric layer 210 do not need to be rinsed because the basic developer/quencher solution will lift off and diffuse out of the photoresist 220 once the pressure is altered to change the basic developer/quencher solution 235 into a gaseous solution from either a supercritical fluid or a gas. The substrate 200 may then be moved to an etching chamber where the exposed portions of the dielectric material 210 underlying the photoresist 220 may be etched to form the intended features. Rinse and vent process schemes can be employed to remove the base and other additives from the process chamber, where applicable rinse materials may be a pure stream of supercritical $CO_2$.

Figure 2H:
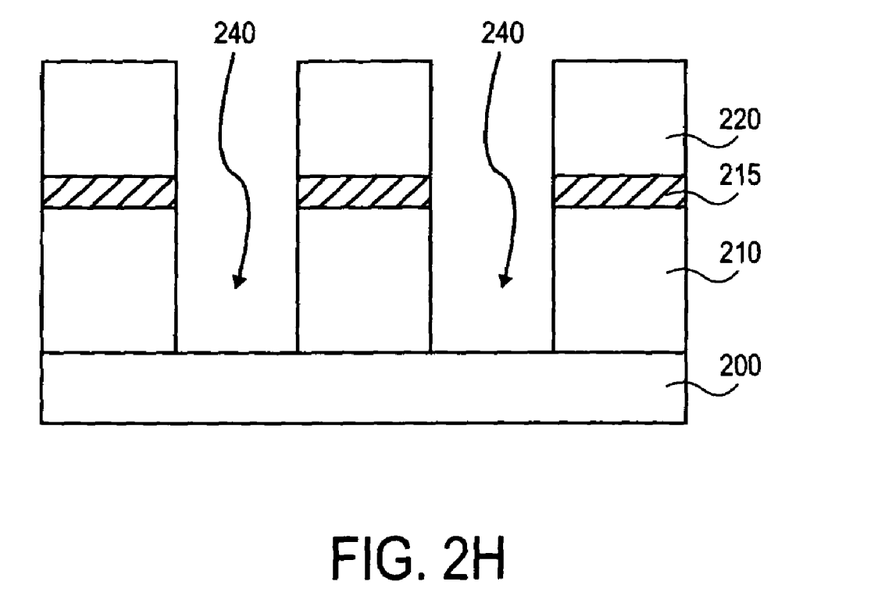
Figure 2I:
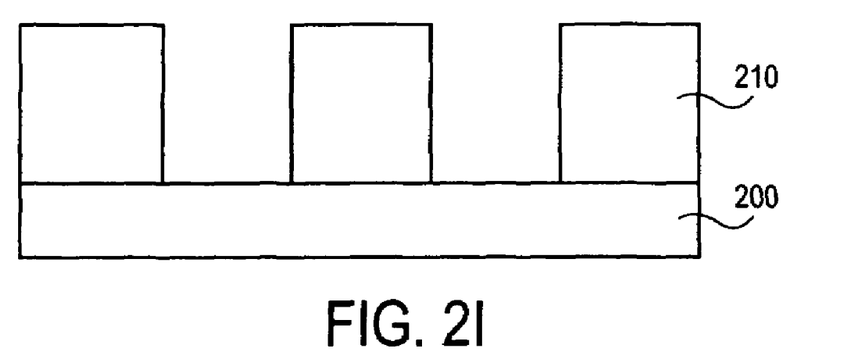

After the photoresist 220 is developed and removed, vias 240 are etched through dielectric layer 210 down to substrate 200, as illustrated in FIG. 2h. Conventional process steps for etching through a dielectric layer 210 may be used to etch the via, e.g., a conventional anisotropic dry etch process. When silicon dioxide is used to form dielectric layer 210, the vias 240 may be etched using a medium density magnetically enhanced reactive ion etching system ("MERIE" system) using fluorocarbon chemistry. When a polymer is used to form dielectric layer 210, a forming gas chemistry, e.g., one including nitrogen and either hydrogen or oxygen, may be used to etch the polymer. After vias 240 are formed through dielectric layer 210, the photoresist 220 and the BARC 215 are removed. Photoresist 220 and BARC 215 may be removed using a conventional ashing procedure as illustrated in FIG. 2i.

Figure 2J:
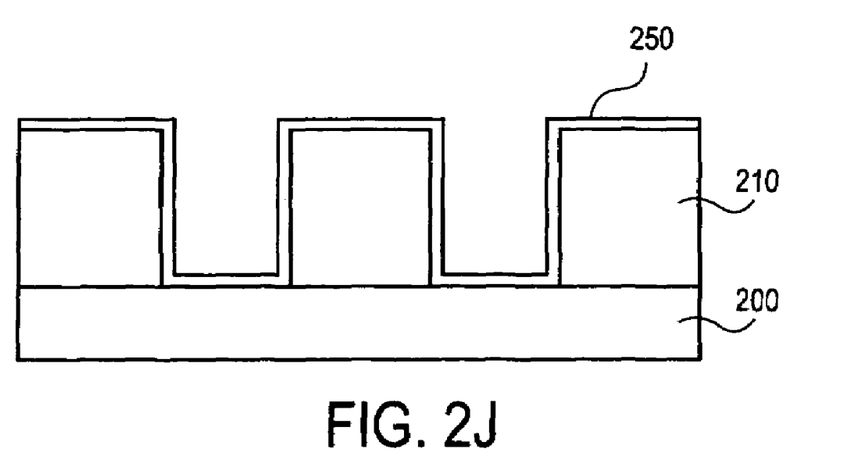

A barrier layer 250 is then formed over the vias 240 and the dielectric 210 as illustrated in FIG. 2j. The barrier layer 250 may comprise a refractory material, such as titanium nitride and may have a thickness in the approximate range of 100 and 500 angstroms. The barrier layer may be deposited by chemical vapor deposition (CVD), sputter deposition, or atomic layer deposition (ALD). The purpose of the barrier layer 250 is to prevent metals such as copper that expand at temperatures used in semiconductor processing from bleeding out of the vias and causing shorts. A metal layer 260 is then deposited into the vias 240. The metal layer may be copper, copper alloy, gold, or silver. In one particular embodiment copper is deposited to form the metal layer 260. Copper may be deposited by electroplating or electroless (catalytic) deposition that require first depositing a seed material in the vias 240. Suitable seed materials for the deposition of copper by electroplating or electroless deposition include copper and nickel. The barrier layer 250 may also serve as the seed layer.

Figure 2K:
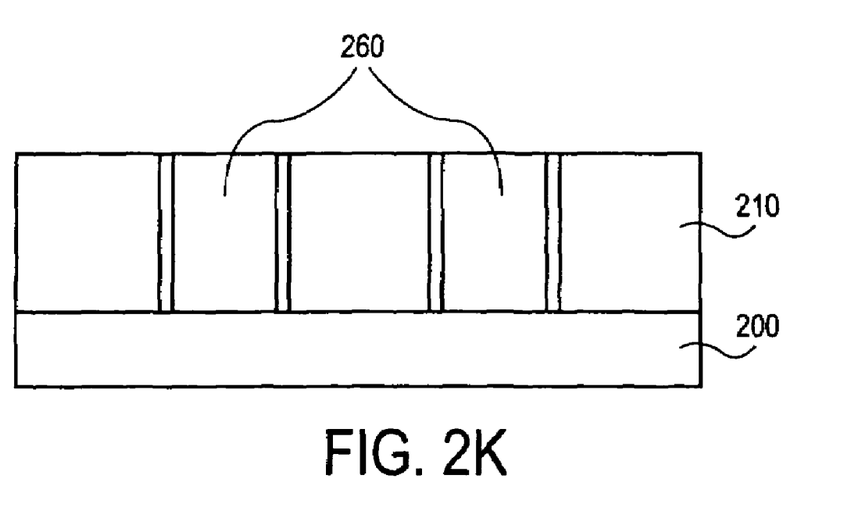

FIG. 2k illustrates the structure that results after filling vias 240 with a conductive material. Although the embodiment illustrated in FIG. 2k illustrates only one dielectric layer 210 and vias 240, the process described above may be repeated to form additional conductive and insulating layers until the desired integrated circuit is produced.

Several embodiments have thus been described. However, those of ordinary skill in the art will recognize that the embodiments are not, but can be practiced with modification and alteration within the scope and spirit of the appended claims that follow.

We claim:

1. A process, comprising:
    irradiating a photoresist on a substrate; and
    exposing the photoresist to a basic developer/quencher solution comprising carbon dioxide and a base,
    wherein the base is a quaternary ammonium salt further comprising a side chain that increases the solubility of the quaternary ammonium salt in carbon dioxide.

2. The process of claim 1, wherein exposing the photoresist to the basic developer/quencher solution comprises exposing the photoresist to the solution comprising supercritical carbon dioxide and the base.

3. The process of claim 1, wherein exposing the photoresist to the basic developer/quencher solution comprises exposing the photoresist to the solution comprising liquid carbon dioxide and the base.

4. The process of claim 1, further comprising flowing gaseous carbon dioxide and the base into a chamber having a first temperature and pressure, stopping the flowing of the gaseous carbon dioxide and the base into the chamber, and creating a second temperature and a second pressure within the chamber to form basic supercritical carbon dioxide before exposing the photoresist to the developer/quencher solution.

5. The process of claim 1, further comprising flowing gaseous carbon dioxide and the base into a chamber having a first temperature and pressure, stopping the flowing of the gaseous carbon dioxide and the base into the chamber, and creating a second temperature and a second pressure within the chamber to form liquid carbon dioxide before exposing the photoresist to the developer/quencher solution.

6. The process of claim 1, further comprising removing the developer/quencher solution from the photoresist by changing the pressure within a chamber containing the photoresist and the developer/quencher solution to convert the developer/quencher solution into a gas.

7. A process, comprising:
    irradiating a photoresist on a substrate to create a photo-generated acid;
    heating the photoresist in a post-exposure bake;
    quenching the photo-generated acid with a solution comprising carbon dioxide and a base; and
    developing the photoresist with the solution comprising carbon dioxide and the base,
    wherein the base is a quaternary ammonium salt further comprising a side chain that increases the solubility of the quaternary ammonium salt in carbon dioxide.

8. The method of claim 7, wherein quenching the photo-generated acid and developing the photoresist occurs simultaneously with the same solution.

9. The method of claim 7, further comprising converting the solution comprising carbon dioxide and a base to stop quenching the photo-generated acid and developing the photoresist.

* * * * *

UNITED STATES PATENT AND TRADEMARK OFFICE
CERTIFICATE OF CORRECTION

PATENT NO. : 7,241,560 B2 Page 1 of 1
APPLICATION NO. : 11/143126
DATED : July 10, 2007
INVENTOR(S) : Clark et al.

It is certified that error appears in the above-identified patent and that said Letters Patent is hereby corrected as shown below:

In column 5, at line 48, delete "quartemary" and insert --quarternary--.

Signed and Sealed this

Twenty Second Day of April, 2008

JON W. DUDAS
*Director of the United States Patent and Trademark Office*